(12) United States Patent
Wu

(10) Patent No.: US 12,249,954 B2
(45) Date of Patent: Mar. 11, 2025

(54) CONSTANT-GM CURRENT SOURCE

(71) Applicant: Nordic Semiconductor ASA, Trondheim (NO)

(72) Inventor: Hsin-Ta Wu, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 63 days.

(21) Appl. No.: 18/030,752

(22) PCT Filed: Oct. 13, 2021

(86) PCT No.: PCT/EP2021/078278
§ 371 (c)(1),
(2) Date: Apr. 6, 2023

(87) PCT Pub. No.: WO2022/079086
PCT Pub. Date: Apr. 21, 2022

(65) Prior Publication Data
US 2023/0387854 A1  Nov. 30, 2023

(30) Foreign Application Priority Data
Oct. 13, 2020 (GB) ................................ 2016243

(51) Int. Cl.
*H03B 5/04* (2006.01)
*G05F 3/24* (2006.01)
(Continued)

(52) U.S. Cl.
CPC .............. *H03B 5/04* (2013.01); *G05F 3/242* (2013.01); *G05F 3/245* (2013.01); *G05F 3/262* (2013.01);
(Continued)

(58) Field of Classification Search
CPC .. H03B 5/04; H03B 5/364; H03B 2200/0012; H03B 2200/0038; G05F 3/245; G05F 3/242; G05F 3/262
(Continued)

(56) References Cited

U.S. PATENT DOCUMENTS 6,271,710 B1    8/2001  Ooishi
7,196,586 B1 *  3/2007  Stiff ........................ H03F 1/342
                                                             330/311
(Continued)

OTHER PUBLICATIONS

International Search Report and Written Opinion for PCT/EP2021/078278, mailed Jan. 25, 2022, 12 pages.
(Continued)

*Primary Examiner* — Arnold M Kinkead
(74) *Attorney, Agent, or Firm* — Klarquist Sparkman, LLP

(57) ABSTRACT

A constant-$g_m$ current source, arranged to generate a supply current for a Pierce oscillator. First and second transistors have source terminals connected to first and second supply rails, respectively, and drain terminals connected together and to the gate terminal of the first transistor. Third and fourth transistors have source terminals connected to the first and second supply rails, respectively, and drain terminals are connected together and to the gate terminal of the fourth transistor. An output portion varies the supply current in response to a voltage at the drain terminals of the third and fourth transistors. The gate terminals of the first and third transistors are connected together, and the gate terminals of the second and fourth transistors are connected together. An auto-calibration transistor has its source terminal connected to the first supply rail and its drain terminal connected to the source terminal of the first transistor.

13 Claims, 7 Drawing Sheets

(51) Int. Cl.
*G05F 3/26* (2006.01)
*H03B 5/36* (2006.01)

(52) U.S. Cl.
CPC ..... *H03B 5/364* (2013.01); *H03B 2200/0012* (2013.01); *H03B 2200/0038* (2013.01)

(58) Field of Classification Search
USPC .......................... 331/175, 183, 158, 116 FE
See application file for complete search history.

(56) References Cited

U.S. PATENT DOCUMENTS

| | | |
|---|---|---|
| 7,868,710 B1 | 1/2011 | Farahvash et al. |
| 9,252,794 B1 | 2/2016 | Feng et al. |
| 9,483,069 B2 | 11/2016 | Xu |
| 9,964,975 B1 | 5/2018 | Zanetta et al. |
| 2020/0177127 A1 | 6/2020 | Hao |

OTHER PUBLICATIONS

IPO Search Report under Section 17(5) for GB2016243.4, mailed Jan. 4, 2021, 3 pages.
Communication, European Patent Application No. 21790889.6, 6 pages, May 3, 2024.

\* cited by examiner

| Arrangement of Fig. 2: R1 - No discrete trimming; No R2 (Conventional PMOS constant-gm current source 2' of Fig. 2) |||| 
|---|---|---|---|
| Crystal type | Max(Negative Resistance in Ohm) | Min(Negative Resistance in Ohm) | Max/Min |
| FA128_TYPICAL | 310.2 | 189.1 | 1.64 |

Fig. 5
Prior Art

Arrangement of Fig. 3:
R1' - discrete trimming; R2 - PMOS in linear region with auto-calibration transistor P6

| Crystal type | Max(Negative Resistance in Ohms) | Min(Negative Resistance in Ohms) | Max/Min |
|---|---|---|---|
| FA128_TYPICAL | 256.7 | 229.5 | 1.12 |
| FA128_WORST | 213.8 | 191.1 | 1.12 |
| NX1210AB_TYPICAL | 276.8 | 247.2 | 1.12 |
| NX1210AB_WORST | 225.3 | 201.2 | 1.12 |
| NX1612AA_TYPICAL | 278.2 | 248.4 | 1.12 |
| NX1612AA_WORST | 226.8 | 202.6 | 1.12 |
| FA20H_TYPICAL | 235.4 | 210.7 | 1.12 |
| FA20H_WORST | 195.2 | 174.6 | 1.12 |
| TSX3225_TYPICAL | 176.2 | 157.7 | 1.12 |
| TSX3225_WORST | 148.8 | 133.1 | 1.12 |

Fig. 6

Arrangement of Fig. 3 without R2:
R1' - discrete trimming; No R2

| Crystal type | Max(Negative Resistance in Ohm) | Min(Negative Resistance in Ohm) | Max/Min |
|---|---|---|---|
| FA128_TYPICAL | 244.8 | 189.1 | 1.29 |
| FA128_WORST | 203.9 | 157.4 | 1.30 |
| NX1210AB_TYPICAL | 263.9 | 203.4 | 1.30 |
| NX1210AB_WORST | 214.8 | 165.6 | 1.30 |
| NX1612AA_TYPICAL | 265.2 | 204.4 | 1.30 |
| NX1612AA_WORST | 216.3 | 166.7 | 1.30 |
| FA20H_TYPICAL | 224.6 | 173.8 | 1.29 |
| FA20H_WORST | 186.2 | 144 | 1.29 |
| TSX3225_TYPICAL | 168.1 | 130.1 | 1.29 |
| TSX3225_WORST | 142 | 109.8 | 1.29 |

Fig. 7

CONSTANT-GM CURRENT SOURCE

CROSS REFERENCE TO RELATED APPLICATIONS

This is the U.S. National Stage of International Application No. PCT/EP2021/078278, filed Oct. 13, 2021, which was published in English under PCT Article 21(2), which in turn claims the benefit of Great Britain Application No. 2016243.4, filed Oct. 13, 2020.

TECHNICAL FIELD

The present invention relates to a constant-$g_m$ current source, particularly but not exclusively a constant-$g_m$ current source suitable for use with a Pierce oscillator.

Background

Many integrated circuits (ICs) require one or more alternating signals each having a respective frequency. Generally, it is important to ensure that the frequency is stable and accurate because the signals may be used for e.g. timing circuits and/or radio components (e.g. for modulation and/or demodulation in a radio transceiver). There are several oscillator circuits, known in the art per se, that generate these alternating signals. A particular set of these are known as 'crystal oscillators' due to their inclusion of a piezoelectric crystal, which can typically generate a highly accurate alternating voltage at a specified frequency.

The 'Pierce oscillator', named after its original inventor George W. Pierce, is a type of crystal oscillator circuit that is particularly well-suited for use in IC applications. Many digital clock oscillators used in ICs are of the Pierce type.

Pierce oscillators are generally employed because they can be implemented using relatively few components. A Pierce oscillator is typically constructed from a digital inverter, a resistor, two capacitors, and a piezoelectric crystal (typically quartz), which acts as a highly selective filter element. This small number of components leads to a low bill-of-materials and cost. Additionally, the quartz crystal has particularly good frequency stability, which is desirable in many electronics applications.

The inverter of the Pierce oscillator—referred to herein as the 'Pierce inverter'-generally requires a current source that supplies it with the current (referred to herein as $I_{PIERCE}$) that it needs to maintain the oscillations. In particular, the current source may generally be designed to have a constant transconductance $g_m$, where such current sources are referred to as a 'constant-$g_m$ circuit' or 'constant-$g_m$ current source'.

Conventional constant-$g_m$ circuits, known in the art per se, may utilise metal-oxide-semiconductor (MOS) devices to generate $I_{PIERCE}$, and there are n-channel (NMOS) and p-channel (PMOS) based constant-$g_m$ circuits, known in the art per se, that can generate this current. These known constant-$g_m$ circuits provide a dynamically adjusted $I_{PIERCE}$ to the Pierce inverter to achieve a constant transconductance $g_m$ across process corners and operational temperatures.

However, such known constant-$g_m$ circuits generally only work within quite specific operational ranges. As will be appreciated by those skilled in the art, the Pierce inverter generally exhibits a 'negative resistance' that acts to counter losses in the 'tank' (i.e. the resonant circuit) of the Pierce oscillator. The negative resistance $R_{NEG}$ generated by the Pierce inverter when supplied by a conventional constant-$g_m$ current source may fluctuate significantly between different process corners. As such, the ratio between the maximum and minimum negative resistances can be relatively high, which is undesirable.

The Applicant has appreciated that there are many possible options when choosing commercial crystals for use in the Pierce oscillator, where each of these crystals will have different Q-factors, different package types, different model parameters (even with the same package size), and all of these need to have enough $R_{NEG}$ from the Pierce inverter to be suitable for driving the crystal and for sustaining the oscillation. As such, the current $I_{PIERCE}$ must be adjusted manually for the specific crystal being used in a given circuit, which is cumbersome.

The Applicant has therefore appreciated that it would be beneficial to provide an improved constant-$g_m$ current source, suitable for use in a Pierce oscillator, that can work with a wider variety of crystals than is typically achievable with conventional circuits.

SUMMARY OF THE INVENTION

When viewed from a first aspect, the present invention provides a constant-$g_m$ current source arranged to generate a supply current for a Pierce oscillator, the constant-$g_m$ current source comprising:
 a first transistor and a second transistor, arranged such that the source terminal of the first transistor is connected to a first supply rail, the source terminal of the second transistor is connected to a second supply rail, and the drain terminals of the first and second transistors are connected to each other and to the gate terminal of the first transistor;
 a third transistor and a fourth transistor, arranged such that the source terminal of the third transistor is connected to the first supply rail, the source terminal of the fourth transistor is connected to the second supply rail, and the drain terminals of the third and fourth transistors are connected to each other and to the gate terminal of the fourth transistor;
 an output portion arranged to vary the supply current in response to a voltage at the drain terminals of the third and fourth transistors
 wherein the gate terminals of the first and third transistors are connected to each other and are each supplied with a gate voltage, and wherein the gate terminals of the second and fourth transistors are connected to each other;
 the constant-$g_m$ current source further comprising:
 a reference resistive element connected between the source terminal of the third transistor and the first supply rail, wherein the resistance of said reference resistive element is set to a predetermined value; and
 an auto-calibration transistor having its source terminal connected to the first supply rail and its drain terminal connected to the source terminal of the first transistor, wherein the gate terminal of said auto-calibration transistor is supplied with the gate voltage.

This first aspect of the invention extends to an electronic device comprising a Pierce oscillator and a constant-$g_m$ current source in accordance with the first aspect, wherein the Pierce oscillator comprises:
 an inverter having an input terminal and an output terminal, said inverter being arranged to receive a supply current from the constant-$g_m$ current source;
 a piezoelectric element connected between the input and output terminals of the inverter;

a resistor connected between the input and output terminals of the inverter;
a first capacitor connected between the input terminal of the inverter and ground; and
a second capacitor connected between the output terminal of the inverter and ground.

Thus, the first aspect of the invention extends to an electronic device comprising a Pierce oscillator and a constant-$g_m$ current source, wherein:
the Pierce oscillator comprises:
an inverter having an input terminal and an output terminal, said inverter being arranged to receive a supply current from the constant-$g_m$ current source;
a piezoelectric element connected between the input and output terminals of the inverter;
a resistor connected between the input and output terminals of the inverter;
a first capacitor connected between the input terminal of the inverter and ground; and
a second capacitor connected between the output terminal of the inverter and ground; and
wherein the constant-$g_m$ current source comprises:
a first transistor and a second transistor, arranged such that the source terminal of the first transistor is connected to a first supply rail, the source terminal of the second transistor is connected to a second supply rail, and the drain terminals of the first and second transistors are connected to each other and to the gate terminal of the first transistor;
a third transistor and a fourth transistor, arranged such that the source terminal of the third transistor is connected to the first supply rail, the source terminal of the fourth transistor is connected to the second supply rail, and the drain terminals of the third and fourth transistors are connected to each other and to the gate terminal of the fourth transistor;
an output portion arranged to vary the supply current in response to a voltage at the drain terminals of the third and fourth transistors;
wherein the gate terminals of the first and third transistors are connected to each other and are each supplied with a gate voltage, and wherein the gate terminals of the second and fourth transistors are connected to each other;
the constant-$g_m$ current source further comprising:
a reference resistive element connected between the source terminal of the third transistor and the first supply rail, wherein the resistance of said reference resistive element is set to a predetermined value; and
an auto-calibration transistor having its source terminal connected to the first supply rail and its drain terminal connected to the source terminal of the first transistor, wherein the gate terminal of said auto-calibration transistor is supplied with the gate voltage.

Thus it will be appreciated that embodiments of the present invention provide an improved constant-$g_m$ current source for use with a Pierce oscillator, and an electronic device comprising the same together with a Pierce oscillator. The constant-$g_m$ current source of the present invention advantageously scales the output current provided to the Pierce inverter depending on the internal process variations of the device. As will be explained in further detail below, this results in less variations between the maximum and minimum negative resistance values exhibited by a Pierce oscillator supplied by the constant-$g_m$ current source of the present invention. In other words, the ratio between the maximum negative resistance and the minimum negative resistance of the Pierce oscillator is reduced compared to a Pierce oscillator supplied by a conventional constant-$g_m$ current source.

Specifically, the voltage at the gate terminals of the first and third transistor depends on the process, supply voltage, and temperature (PVT) variations of the device. As the auto-calibration transistor is also subject to these same PVT variations, and its gate terminal is supplied with the same voltage as the gates of the first and third transistors, this auto-calibration transistor operates in its triode region and thus has resistor-like behaviour, i.e. there is a relatively linear, Ohmic-like relationship between its drain-source voltage and drain-source current.

In some embodiments, the auto-calibration transistor comprises a PMOS transistor, the first and third transistors comprise PMOS transistors, and the second and fourth transistors comprise NMOS transistors. In such embodiments, the first supply rail may comprise a positive voltage supply rail and the second supply rail may comprise ground (or a negative voltage supply rail).

Alternatively, an NMOS-based circuit may be achieved in which the auto-calibration transistor comprises an NMOS transistor, the first and third transistors comprise NMOS transistors, and the second and fourth transistors comprise PMOS transistors. In such embodiments, the second supply rail may comprise a positive voltage supply rail and the first supply rail may comprise ground (or a negative voltage supply rail).

It will be appreciated that the current generated by the constant-$g_m$ current source is provided to the Pierce inverter by the output portion. In some embodiments, the output portion comprises an output transistor having its gate terminal connected to the drain terminals of the third and fourth transistors, wherein a voltage at the gate terminal of the output transistor varies a drain-source current through said output transistor, wherein the supply current is or is derived from said drain-source current. The source terminal of the output transistor may, in some such embodiments, be connected to the second supply rail.

The output transistor may comprise a PMOS transistor, particularly in embodiments in which the first and third transistors are NMOS transistors, the second and fourth transistors are PMOS transistors, the first supply rail is ground (or a negative supply), and the second supply rail is the positive supply rail. Thus, in a set of embodiments, the output transistor is arranged such that its source terminal is connected to the positive supply rail. The drain terminal of the output transistor may be connected to the inverter, e.g. to a supply current input of the inverter.

However, in alternative embodiments, the output transistor may comprise an NMOS transistor. Where the output transistor comprises an NMOS transistor, a current mirror may be used in a set of such embodiments to supply the drain-source current through the output transistor, or a current derived therefrom, to the inverter, as outlined below.

Depending on the overall topology, and the types of device being used for each of the transistors, the drain-source current of the output transistor may be suitable for use as the supply current directly. In embodiments in which the output transistor comprises a PMOS transistor, the drain-source current of the output transistor may be supplied directly to the inverter of the Pierce oscillator. In other words, the output transistor may be arranged such that its source terminal is connected to the positive supply rail, and its drain terminal is connected (or arranged for connection) to the inverter.

In another set of embodiments, however, the supply current provided to the Pierce inverter may be derived from the drain-source current of the output transistor, rather than being the drain-source current itself. This may, at least in some embodiments, be achieved with a current mirror. The current mirror may comprise first and second current mirror transistors, arranged such that:
  the source terminals of the first and second current mirror transistors are connected to the first supply rail;
  the gate terminals of the first and second current mirror transistors are connected to each other, to the drain terminal of the first current mirror transistor, and to the drain terminal of the output transistor; and
  the drain terminal of the second current mirror transistor is connected (or arranged for connection) to the inverter.

As will be appreciated by those skilled in the art, such a current mirror acts to 'mirror' the current through the output transistor (and thus through the diode-connected first current mirror transistor) to the second current mirror transistor and therefore to the Pierce inverter when connected. Where provided, the first and second current mirror transistors may comprise PMOS transistors, and the first supply rail may, as outlined above, be the positive supply rail. The second supply rail (to which the source terminal of the output transistor may be connected as outlined above) may be ground or the negative supply rail as appropriate.

The reference resistive element may be a fixed resistor, i.e. it may be selected so as to give a 'typical' gate voltage suitable for a given crystal (i.e. the voltage at the gate terminals of the first and third transistors, and the gate terminal of the auto-calibration transistor). However, in some embodiments the reference resistive element comprises a variable (or 'trimmable') resistor. In a set of embodiments, the reference resistive element may comprise a plurality of resistors and a switching arrangement that selectively enables a selection of said plurality of resistors thereby setting the resistance of said reference resistive element. For example, the reference resistive element may comprise a switched array or matrix of resistors.

It will be appreciated by those skilled in the art that a transistor typically has an associated 'aspect ratio', i.e. the ratio between the channel width and length of that transistor (W/L)—sometimes referred to in the art as the W/L ratio of the transistor. In some embodiments, a W/L ratio of the third transistor is greater than a W/L ratio of the first transistor. In some such embodiments, the W/L ratio of the third transistor is four times greater than the W/L ratio of the first transistor.

The W/L ratios of the second and fourth transistors may be substantially equal. By having these W/L ratios substantially equal, the current through each of the first and third transistors may advantageously be set to be substantially equal as a result.

BRIEF DESCRIPTION OF DRAWINGS

Certain embodiments of the invention will now be described, by way of example only, with reference to the accompanying drawings in which:

FIG. 5 is a table of simulation results for the prior art arrangement of FIG. 2;

FIG. 6 is a table of simulation results for the arrangement of FIG. 3; and

FIG. 7 is a table of simulation results for the arrangement of FIG. 3 without the auto-calibration resistor.

DETAILED DESCRIPTION

Figure 1:
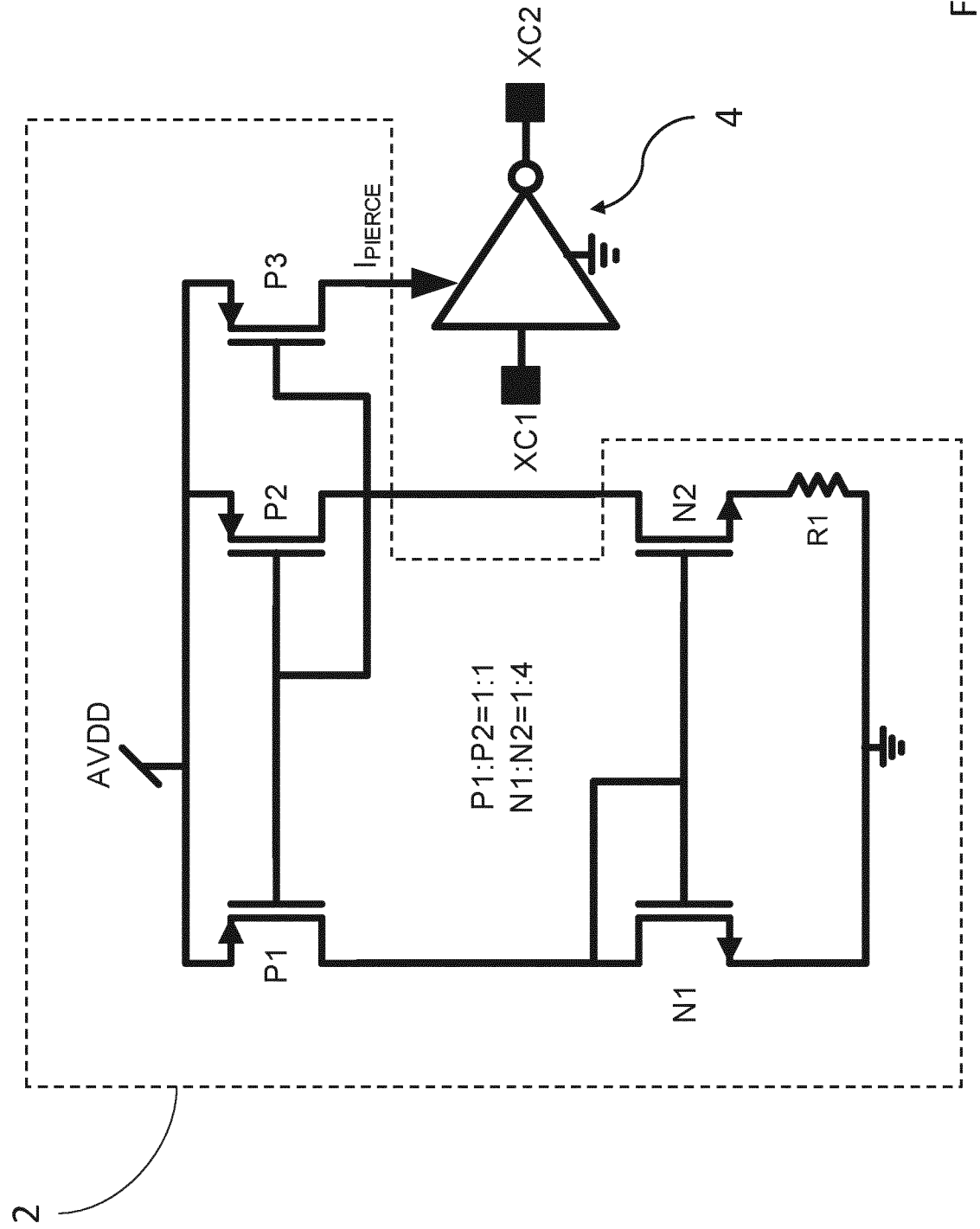
FIG. 1 is a circuit diagram of a prior art NMOS-based constant-$g_m$ current source for use with a Pierce oscillator.

FIG. 1 is a circuit diagram of a prior art NMOS-based constant-$g_m$ current source 2 for use with a Pierce oscillator, and in particular to supply the inverter 4 of the Pierce oscillator. The details of the Pierce oscillator are not described in detail as the structure and function of a Pierce oscillator are well known in the art per se.

The constant-$g_m$ current source 2 provides a dynamically-adjusted supply current $I_{PIERCE}$ to the inverter 4 of the Pierce oscillator, i.e. to the 'Pierce inverter'. This supply current $I_{PIERCE}$ is adjusted during operation to keep the transconductance $g_m$ of the current source substantially constant across corners and temperatures. However, this only works within certain limits.

The dynamically-adjusted supply current $I_{PIERCE}$ to the Pierce inverter 4 is achieved with the 'NMOS-based' topology shown in FIG. 1. Note that the terms 'NMOS-based' and 'PMOS-based' as used herein do not mean that the associated current source only uses NMOS or PMOS devices respectively, but instead refers to which device type is used for which purpose.

The two PMOS transistors P1, P2 have substantially equal W/L ratios, i.e. there is a 1:1 relationship between the W/L ratios of P1 and P2. However, the two NMOS transistors N1, N2 are scaled such that the W/L ratio of N2 is four times greater than the W/L ratio of N1, i.e. there is a 1:4 relationship between the W/L ratios of N1 and N2. It will be appreciated, however, that other factors between the W/L ratios of N1 and N2, and thus in general the W/L of N2 is a factor 'm' greater than the W/L of N1.

The constant-$g_m$ current source 2 is constructed from a pair of PMOS transistors P1, P2 and a pair of NMOS transistors N1, N2. The first PMOS transistor P1 and the first NMOS transistor N1 form a 'first branch' and the second PMOS transistor P2 and the second NMOS transistor N2 form a 'second branch'.

The first branch is arranged such that the source terminal of N1 is connected to ground, and the source terminal of P1 is connected to the positive supply rail AVDD. The drain terminals of P1 and N1 are connected to each other and to the gate terminal of N1.

The gate terminals of P1 and P2 are connected to each other. Similarly, the gate terminals of N1 and N2 are also connected to each other.

The second branch is arranged such that the source terminal of N2 is connected to ground via a fixed resistor R1, and the source terminal of P2 is connected to the positive supply rail AVDD. The drain terminals of P2 and N2 are connected to each other and to the gate terminal of P2.

A PMOS output transistor P3 is arranged such that its gate terminal is connected to the drain terminals of P2 and N2. Thus the voltage at the gate terminal of the output transistor P3 varies the drain-source current through the output transistor P3, which is provided as the supply current $I_{PIERCE}$ to the Pierce inverter 4, i.e. the drain terminal of P3 is connected to the Pierce inverter 4. The source terminal of P3 is connected to the positive supply rail AVDD.

Generally, the current through N2 is equal to the magnitude of the difference between the gate-source voltages of the N1 and N2 divided by the resistance of R1 in accordance with Equation 1:

The current through the first and third transistors  Equation 1

$$I_2 = \frac{|V_{gs1} - V_{gs2}|}{R_1} = \frac{\Delta V_{gs}}{R_1} = \frac{\Delta V_{od}}{R_1} = I_1 = I$$

where: I is the current, $I_1$ is the current through N1, $I_2$ is the current through N2, $V_{gs1}$ is the gate-source voltage of N1, $V_{gs2}$ is the gate-source voltage of N2, $\Delta V_{gs}$ is the difference in these gate-source voltages, $V_{od}$ is the difference between the gate-source voltage $V_{gs}$ and the threshold voltage $V_{th}$ for a given transistor (as outlined further below below) and thus $\Delta V_{od}$ is the difference between this value for the two transistors N1, N2.

The transconductance $g_m$ is given as per Equation 2 below:

The transconductance of the current source 2  Equation 2

$$g_{m1} = \frac{2 \times I}{V_{od1}} = \frac{2(\Delta V_{od})}{(R1 \times V_{od1})} = (2 \times R1) \times \left(1 - \frac{V_{od2}}{V_{od1}}\right) = \frac{2}{R1}\left(1 - \frac{1}{\sqrt{m}}\right)$$

where: $g_{m1}$ is the transconductance of N1, $V_{od1}$ is the difference between the respective gate-source voltage $V_{gs}$ and the threshold voltage $V_{th}$ of N1, $V_{od2}$ is the difference between the respective gate-source voltage $V_{gs}$ and the threshold voltage $V_{th}$ of N2, and m is the factor by which the aspect ratio W/L of N2 is greater than the aspect ratio W/L of N1.

By using Equation 3 below:

Relationship between the output voltages and the factor m  Equation 3

$$\frac{V_{od2}}{V_{od1}} = \sqrt{\frac{W1}{W2}} = \frac{1}{\sqrt{(m)}}$$

and setting m to 4, then the transconductance of N1

$$g_{m1} = \frac{1}{R1},$$

and thus the transconductance $g_{m1}$ depends only on the value of R1, thereby providing the constant-$g_m$ function of the current source 2.

By simulating the negative resistance $R_{NEG}$ generated by the Pierce inverter 4 for a given supply current $I_{PIERCE}$, the ratio between the maximum and minimum negative resistances seen—i.e. Max($R_{NEG}$)/Min($R_{NEG}$)—is 1.64. Reducing this ratio would be preferable because this would indicate less fluctuation in the negative resistance $R_{NEG}$ generated by the Pierce inverter 4 across these corners and temperatures.

As will be appreciated by those skilled in the art, the Pierce inverter 4 would typically have a crystal (e.g. a quartz crystal) connected across its terminals XC1, XC2. However, there are many possible options when choosing commercial crystals. For examples, different Q-factors, different package types, and different model parameters even with the same package size, all influence the need to have sufficient negative resistance $R_{NEG}$ generated by the Pierce inverter 4 in order to drive the crystal and to sustain the oscillation. With the conventional arrangement of FIG. 1 (and that of FIG. 2 as outlined below), the supply current $I_{PIERCE}$ needs to be adjusted manually for different crystals, which is cumbersome.

Figure 2:
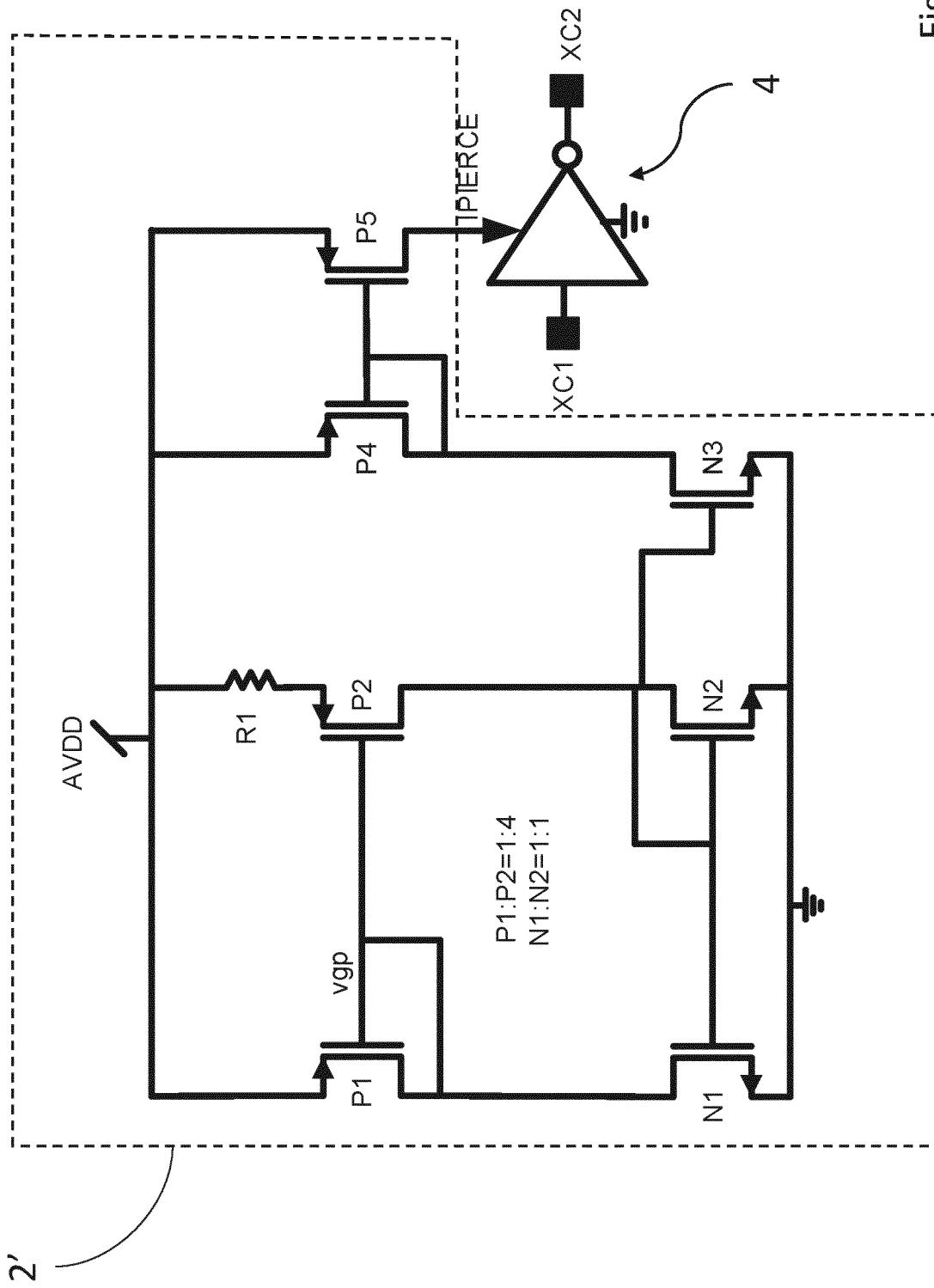
FIG. 2 is a circuit diagram of a prior art PMOS-based constant-$g_m$ current source for use with a Pierce oscillator.

FIG. 2 is a circuit diagram of a prior art PMOS-based constant-$g_m$ current source 2', which supplies the inverter 4 of a Pierce oscillator. As before, the Pierce inverter 4 would typically have a crystal (e.g. a quartz crystal) connected across its terminals XC1, XC2.

The PMOS-based constant-$g_m$ current source 2' provides the dynamically-adjusted supply current $I_{PIERCE}$ to the inverter 4 of the Pierce oscillator, and this supply current $I_{PIERCE}$ is adjusted during operation to keep the transconductance $g_m$ of the current source substantially constant across corners and temperatures. However, as with the arrangement of FIG. 1, this only works within certain limits.

In this arrangement, the two NMOS transistors N1, N2 have substantially equal W/L ratios, i.e. there is a 1:1 relationship between the W/L ratios of N1 and N2. However, the two PMOS transistors P1, P2 are scaled such that the W/L ratio of P2 is four times greater than the W/L ratio of P1, i.e. there is a 1:4 relationship between the W/L ratios of P1 and P2. As before, the 1:4 relationship is only given as an example, and in practice there may be a 1:m relationship between the W/L ratios of P1 and P2.

The constant-$g_m$ current source 2' is constructed from a pair of PMOS transistors P1, P2 and a pair of NMOS transistors N1, N2. The first PMOS transistor P1 and the first NMOS transistor N1 form a 'first branch' and the second PMOS transistor P2 and the second NMOS transistor N2 form a 'second branch'.

The first branch is arranged such that the source terminal of N1 is connected to ground, and the source terminal of P1 is connected to the positive supply rail AVDD. The drain terminals of P1 and N1 are connected to each other and to the gate terminal of P1.

The second branch is arranged such that the source terminal of N2 is connected to ground, and the source terminal of P2 is connected to the positive supply rail AVDD via a fixed resistor R1. The drain terminals of P2 and N2 are connected to each other and to the gate terminal of N2. The gate terminals of P1 and P2 are connected to each other. Similarly, the gate terminals of N1 and N2 are also connected to each other.

An NMOS output transistor N3 is arranged such that its gate terminal is connected to the drain terminals of P2 and N2. Thus, the voltage at the gate terminal of the output transistor P3 varies the drain-source current through the output transistor N3.

The drain terminal of the output transistor N3 is connected to a current mirror formed from a pair of PMOS transistors P4, P5. These transistors P4, P5 are arranged in a current mirror arrangement such that the first mirror transistor P4 is arranged in a 'diode-connected' arrangement, such that its source terminal is connected to AVDD, and its gate and drain terminals are both connected to the drain terminal of the NMOS output transistor N3. The second mirror transistor P5 is arranged such that its source terminal is connected to AVDD, its gate terminal is connected to the gate and drain terminals of P4 (and thus to the drain terminal of N3), and its drain terminal is connected to the Pierce inverter 4.

The drain-source current flowing through the output transistor N3, and thus the drain-source current through the first mirror transistor P4 is 'mirrored' through the second mirror transistor P5. The mirrored current through P5 is provided as the supply current $I_{PIERCE}$ to the Pierce inverter 4, i.e. the drain terminal of P3 is connected to the Pierce inverter 4.

Like the NMOS-based arrangement of FIG. 1, in the PMOS-based arrangement of FIG. 2, the supply current $I_{PIERCE}$ needs to be adjusted manually for different crystals, which is cumbersome. Additionally, the PMOS-based arrangement of FIG. 2 suffers from wide variation in the ratio between the maximum and minimum negative resistances seen—i.e. Max($R_{NEG}$)/Min($R_{NEG}$).

In order to find this value, operation of the arrangement of FIG. 2 across 5 corners was simulated. These five corners are:

1) Typical operation=Room temperature; AVDD at its nominal value
2) Fast_0=High temperature; Nominal AVDD
3) Fast_1=Low temperature; Nominal AVDD
4) Slow_0=High temperature; Nominal AVDD
5) Slow_1=Low temperature; Nominal AVDD It will be appreciated that 'Nominal AVDD' means that the value of AVDD is simulated as its nominal 'design' value.

The results of this simulation can be seen in the table of FIG. 5, which relates to a simulation of a typical 'FA128' crystal. The metric Max($R_{NEG}$)/Min($R_{NEG}$) has been found by simulation to be 1.64 (to two decimal places).

Figure 3:
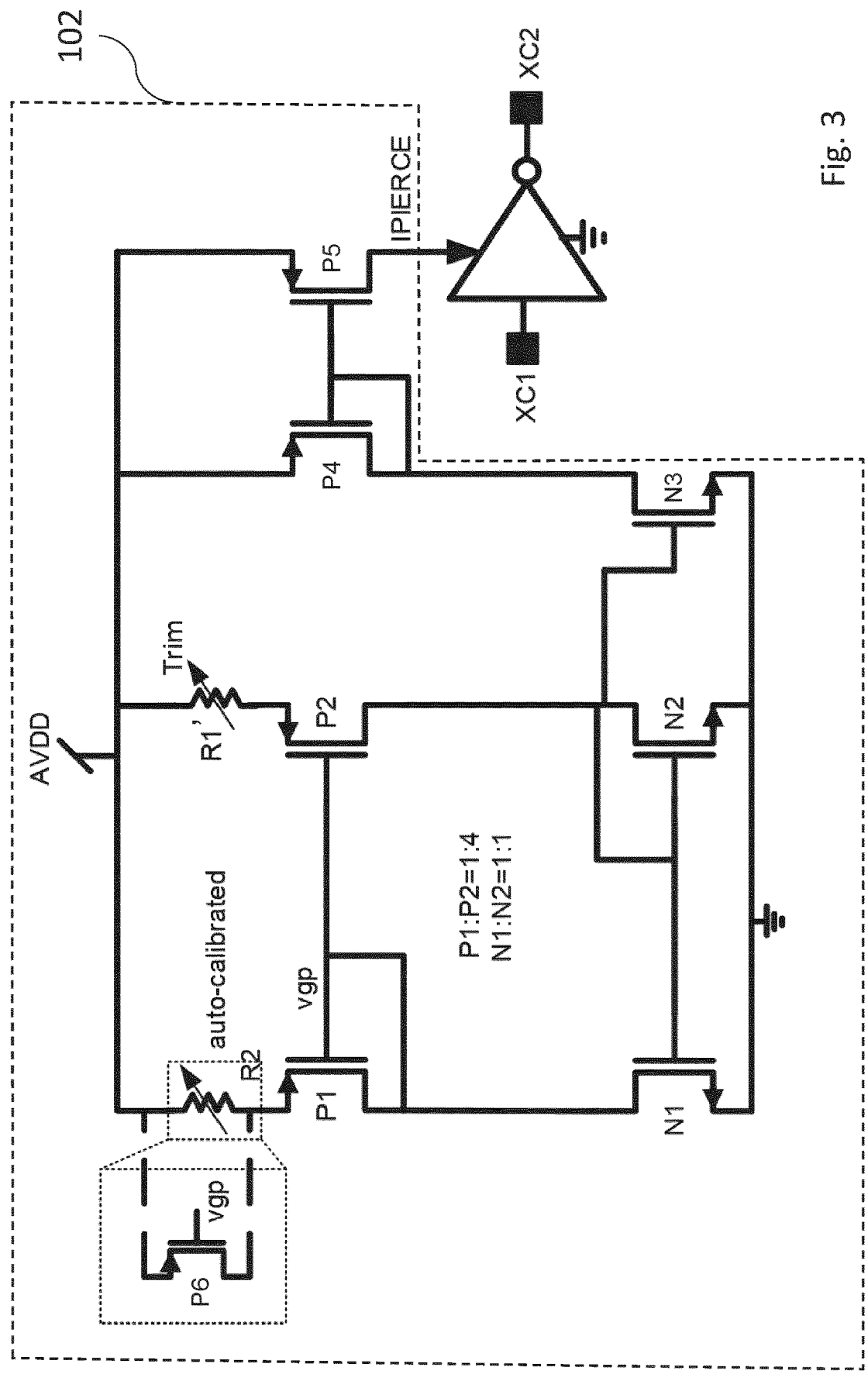
FIG. 3 is a circuit diagram of a constant-$g_m$ current source in accordance with an embodiment of the present invention.

FIG. 3 is a circuit diagram of a constant-$g_m$ current source in accordance with an embodiment of the present invention. The overall topology of the arrangement of FIG. 3 resembles that of the NMOS-based topology of FIG. 2, and elements having like reference numerals to the arrangement of FIG. 2 are alike in structure and function.

However, unlike the arrangement of FIG. 2, the constant-$g_m$ current source 102 of FIG. 3 replaces the fixed resistor between the source terminal of P2 and AVDD with a 'trim' resistor R1'. This resistor R1' provides a 'reference' resistive element. In order to provide the trimmable behaviour, the 'resistor R1' is typically not a single fixed resistor, but instead a matrix (i.e. an array) of resistors and associated switches—such as the matrix shown in FIG. 4—that allow for a given selection of the resistors in the matrix to be 'switched in', thereby setting the resistance of R1'. Other mechanisms suitable for varying the resistance of R1' could be used instead, however.

Figure 4:
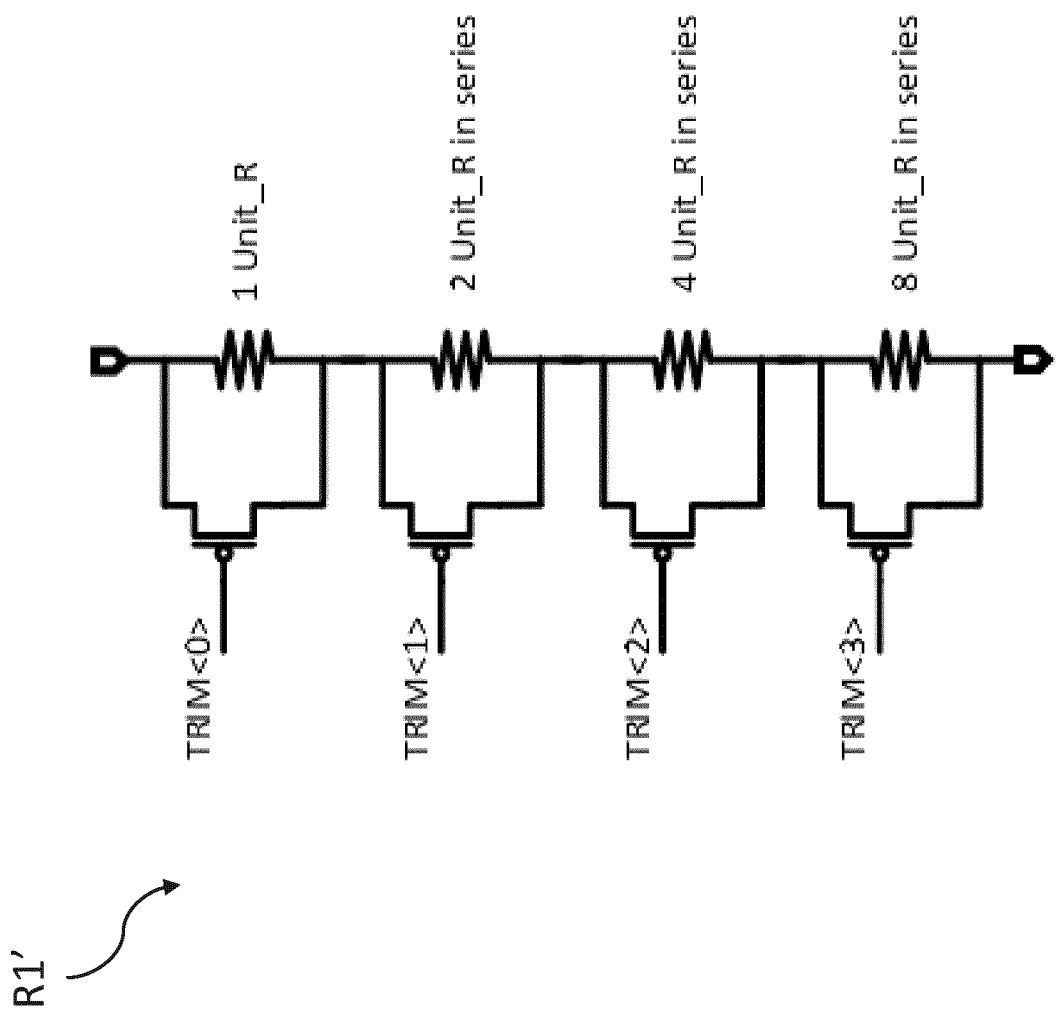
FIG. 4 is a circuit diagram of a trimmable resistor for use in the arrangement of FIG. 3.

As can be seen in FIG. 4, the resistance R1' in this embodiment is controlled by varying a four-bit control word TRIM<0-3>. Depending on the value of each bit TRIM<0-3>, the associated resistor is either 'switched in' or bypassed by the associated switch. In this particular embodiment, the resistors within R1' have increasing resistance, from 1 'unit' resistance, to 2 units, to 4 units, and then 8 units. With all resistors switched in, the total resistance of R1' can be set up to 31 units of resistance. Of course, the resistances do not need to step in this way, or at all (these could all be the same value, for example), and any suitable selection may be made for a particular implementation.

In this case the switches are PMOS transistors but other suitable switches such as NMOS transistors could be used with suitable modification to the circuit and which value of the bits TRIM<0-3> enables and disables the associated resistor.

Referring back to FIG. 3, an additional 'auto-calibration' resistor R2 is provided between the source terminal of P1 and AVDD. In practice, R2 is constructed from a PMOS transistor P6, arranged such that its source terminal is connected to AVDD, and its drain terminal is connected to the source terminal of P1.

While the voltage vgp at the gate terminals of P1 and P2 depends on the process, supply voltage, and temperature (PVT) variations of the device, the auto-calibration transistor P6 is also subject to these same PVT variations.

The gate terminal of P6 (i.e. the auto-calibration resistor R2) is arranged to receive the same voltage vgp that is applied to the gate terminals of P1 and P2. This may be achieved by physically connecting the gates of P1 and P2 to one another, or by supplying the same voltage to both (without a direct connection between them). As the gate terminal of P6 is supplied with the same voltage vgp as the gates of P1 and P2, this auto-calibration transistor P6 operates in its triode region. This means that the transistor P6 has resistor-like behaviour, i.e. there is a relatively linear, Ohmic like relationship between its drain-source voltage and drain-source current.

Like the arrangement of FIG. 2, an NMOS output transistor N3 is arranged such that its gate terminal is connected to the drain terminals of P2 and N2. Thus, the voltage at the gate terminal of the output transistor P3 varies the drain-source current through the output transistor N3. A current mirror formed from a pair of PMOS transistors P4, P5 mirrors the current through this output transistor N3, and supplies the mirrored current IPIERCE to the Pierce inverter 4.

The resistance of R1', i.e. the trimmable resistor, determines the voltage vgp at the gate terminals of P1 and P2, and at the gate terminal of the auto-calibration transistor P6. For a given selected crystal (i.e. to be connected between the XC1 and XC2 terminals of the Pierce inverter 4), the resistance of R1' can be trimmed to a value appropriate for 'normal' operation of the circuit, i.e. with AVDD at its nominal value and room temperature conditions.

Compared to the arrangements of FIGS. 1 and 2, the arrangement of FIG. 3 in accordance with an embodiment of the present invention has a far more consistent the ratio between the maximum and minimum negative resistances seen. As before, the simulated corners are:

1) Typical operation=Room temperature; AVDD at its nominal value
2) Fast_0=High temperature; Nominal AVDD
3) Fast_1=Low temperature; Nominal AVDD
4) Slow_0=High temperature; Nominal AVDD
5) Slow_1=Low temperature; Nominal AVDD The results of this simulation can be seen in the table of FIG. 6. A direct comparison of the typical FA128 crystal (FA128_TYPICAL) to the simulation results associated with the prior art arrangement of FIG. 2 shown in the table of FIG. 5 shows a significant improvement in the ratio of the maximum to minimum negative resistance seen. Specifically, through this simulation, the ratio Max($R_{NEG}$)/Min($R_{NEG}$) for the arrangement of FIG. 3 has been found to be 1.12.

The simulation results in the table of FIG. 6 also show the values found for several other commercially available crystals: NX1210AB; NX1612AA; FA20H; and TSX3225. The '_TYPICAL' and '_WORST' suffixes indicate typical and worst-case simulation results. As can be seen from the results, the ratio Max($R_{NEG}$)/Min($R_{NEG}$) for the arrangement of FIG. 3 has been found to be consistently 1.12 (to two decimal places) for all simulated crystals and scenarios.

Thus, the metric Max($R_{NEG}$)/Min($R_{NEG}$) is significantly lower for the topology of FIG. 3 compared to the prior art arrangements of FIGS. 1 and 2. In other words, the arrangement of FIG. 3 is more consistent across the simulated corners when compared to the described prior art arrangements.

To illustrate the impact of the auto-calibration transistor P6 as an 'automatic' resistance, FIG. 7 provides a further table of simulation results in which R1 is 'trimmed' as above, but no R2 (i.e. no P6) is provided. The ratio Max $(R_{NEG})/Min(R_{NEG})$ is consistently between 1.29 and 1.30 (to two decimal places) for the same crystals and scenarios as in the table of FIG. 6. While the ratio $Max(R_{NEG})/Min(R_{NEG})$ is improved compared to the prior art arrangement, the results are not as consistent as they are for the arrangement of FIG. 3 with an auto-configuration resistor R2, as evidenced in the table of FIG. 6.

It can be seen, therefore, that embodiments of the present invention provide an improved constant-$g_m$ current source for use with a Pierce oscillator, suitable for a variety of different crystals, that is more resilient to PVT variations. The constant-$g_m$ current source of the present invention advantageously results in more consistent negative resistance exhibited by a Pierce oscillator supplied by the constant-$g_m$ current source across different corners.

Those skilled in the art will appreciate that the specific embodiments described herein are merely exemplary and that many variants within the scope of the invention are envisaged.

The invention claimed is:

1. A constant-gm current source arranged to generate a supply current for a Pierce oscillator, the constant-gm current source comprising:
   a first transistor and a second transistor, arranged such that the source terminal of the first transistor is connected to a first supply rail, the source terminal of the second transistor is connected to a second supply rail, and the drain terminals of the first and second transistors are connected to each other and to the gate terminal of the first transistor;
   a third transistor and a fourth transistor, arranged such that the source terminal of the third transistor is connected to the first supply rail, the source terminal of the fourth transistor is connected to the second supply rail, and the drain terminals of the third and fourth transistors are connected to each other and to the gate terminal of the fourth transistor;
   an output portion arranged to vary the supply current in response to a voltage at the drain terminals of the third and fourth transistors
   wherein the gate terminals of the first and third transistors are connected to each other and are each supplied with a gate voltage, and wherein the gate terminals of the second and fourth transistors are connected to each other;
   the constant-gm current source further comprising:
   a reference resistive element connected between the source terminal of the third transistor and the first supply rail, wherein the resistance of said reference resistive element is set to a predetermined value; and
   an auto-calibration transistor having its source terminal connected to the first supply rail and its drain terminal connected to the source terminal of the first transistor, wherein the gate terminal of said auto-calibration transistor is supplied with the gate voltage.

2. The constant-gm current source as claimed in claim 1, wherein the auto-calibration transistor comprises a PMOS transistor, the first and third transistors comprise PMOS transistors, and the second and fourth transistors comprise NMOS transistors.

3. The constant-gm current source as claimed in claim 2, wherein the first supply rail comprises a positive voltage supply rail and the second supply rail comprises ground or a negative voltage supply rail.

4. The constant-gm current source as claimed in claim 1, wherein the output portion comprises an output transistor having its gate terminal connected to the drain terminals of the third and fourth transistors, wherein a voltage at the gate terminal of the output transistor varies a drain-source current through said output transistor, wherein the supply current is said drain-source current or is derived from said drain-source current.

5. The constant-gm current source as claimed in claim 4, wherein the source terminal of the output transistor is connected to the second supply rail.

6. The constant-gm current source as claimed in claim 4, wherein the output transistor comprises a PMOS transistor, optionally wherein the drain-source current of the output transistor is supplied directly to the inverter of the Pierce oscillator.

7. The constant-gm current source as claimed in claim 4, comprising a current mirror comprising first and second current mirror transistors, arranged such that:
   the source terminals of the first and second current mirror transistors are connected to the first supply rail;
   the gate terminals of the first and second current mirror transistors are connected to each other, to the drain terminal of the first current mirror transistor, and to a drain terminal of the output transistor; and
   the drain terminal of the second current mirror transistor is connected to the inverter or is arranged for connection to the inverter.

8. The constant-gm current source as claimed in claim 1, wherein the reference resistive element comprises a variable resistor.

9. The constant-gm current source as claimed in claim 8, wherein the reference resistive element may comprise a plurality of resistors and a switching arrangement that selectively enables a selection of said plurality of resistors thereby setting the resistance of said reference resistive element.

10. The constant-gm current source as claimed in claim 1, wherein a W/L ratio of the third transistor is greater than a W/L ratio of the first transistor.

11. The constant-gm current source as claimed in claim 10, wherein the W/L ratio of the third transistor is four times greater than the W/L ratio of the first transistor.

12. The constant-gm current source as claimed in claim 1, wherein a respective W/L ratio of the second transistor is substantially equal to a respective W/L ratio of the fourth transistor.

13. An electronic device comprising a Pierce oscillator and the constant-gm current source as claimed in claim 1, wherein the Pierce oscillator comprises:
   an inverter having an input terminal and an output terminal, said inverter being arranged to receive a supply current from the constant-gm current source;
   a piezoelectric element connected between the input and output terminals of the inverter;
   a resistor connected between the input and output terminals of the inverter;
   a first capacitor connected between the input terminal of the inverter and ground; and
   a second capacitor connected between the output terminal of the inverter and ground.

* * * * *